United States Patent [19]
Oka

[11] Patent Number: 6,084,300
[45] Date of Patent: *Jul. 4, 2000

[54] COMPACT RESIN-SEALED SEMICONDUCTOR DEVICE

[75] Inventor: Takahiro Oka, Tokyo, Japan

[73] Assignee: Oki Electric Industry Co., Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/986,396

[22] Filed: Dec. 8, 1997

[30] Foreign Application Priority Data

Apr. 21, 1997 [JP] Japan ............................ 9-102871

[51] Int. Cl.⁷ ........................... H01L 23/48; H01L 23/28
[52] U.S. Cl. ..................... 257/730; 257/737; 257/738; 257/666; 257/692; 257/693
[58] Field of Search ................... 257/730, 734, 257/737, 738, 666, 693, 690, 678, 692

[56] References Cited

U.S. PATENT DOCUMENTS

| | | | |
|---|---|---|---|
| 5,045,914 | 9/1991 | Casto et al. | 257/693 |
| 5,433,822 | 7/1995 | Mimura et al. | 257/737 |
| 5,541,450 | 7/1996 | Jones et al. | 257/738 |
| 5,594,275 | 1/1997 | Kwon et al. | 257/686 |
| 5,608,265 | 3/1997 | Kitano et al. | 257/737 |
| 5,668,405 | 9/1997 | Yamashita | 257/737 |
| 5,677,566 | 10/1997 | King et al. | 257/778 |
| 5,717,252 | 2/1998 | Nakashima et al. | 257/738 |
| 5,751,060 | 5/1998 | Laine et al. | 257/758 |
| 5,777,387 | 7/1998 | Yamashita et al. | 257/737 |
| 5,847,455 | 12/1998 | Morheghi | 257/737 |
| 5,886,399 | 3/1999 | Ohsawa et al. | 257/668 |
| 5,895,965 | 4/1999 | Tahaka et al. | 257/668 |
| 5,900,675 | 5/1999 | Appalt et al. | 257/778 |
| 5,901,041 | 5/1999 | Davies et al. | 257/738 |

FOREIGN PATENT DOCUMENTS

| | | |
|---|---|---|
| 0 682 367 A1 | 11/1995 | European Pat. Off. . |
| 0 780 896 A2 | 6/1997 | European Pat. Off. . |
| 44 10 212 A1 | 9/1995 | Germany . |
| 7-321248 | 12/1995 | Japan . |
| 8-139228 | 5/1996 | Japan . |

OTHER PUBLICATIONS

Patent Abstracts of Japan vol. 011, No. 390 (E–567), Dec. 19, 1987 & JP 62 154657 A (Sumitomo Electric Ind Ltd), Jul. 9, 1987, *abstract*.

Patent Abstracts of Japan vol. 097, No. 004, Apr. 30, 1997 & JP 08 330463 A (NEC Kyushu Ltd), Dec. 13, 1996, *abstract*.

Patent Abstracts of Japan vol. 097, No. 002, Feb. 28, 1997 & JP 08 274219 A (Seiko Epson Corp), Oct. 18, 1996, *abstract*.

*Primary Examiner*—Alexander Oscar Williams
*Attorney, Agent, or Firm*—Jones Volentine, L.L.P.

[57] ABSTRACT

A semiconductor device of the present invention is structured such that solder balls for packaging are fixed onto leads protruding from a package to obviate drawbacks inherent in the conventional lead frame type semiconductor device, wherein it is difficult to correspond to the layout of the increased number of pins due to an occurrence of flexure of the lead, and protrusions of the lead terminals from the package resin are disadvantageous for downsizing.

6 Claims, 8 Drawing Sheets

COMPACT RESIN-SEALED SEMICONDUCTOR DEVICE

BACKGROUND OF THE INVENTION

The present invention relates to a semiconductor device of a resin sealing type in which a semiconductor element is sealed with a synthetic resin.

Generally, semiconductor devices of a resin sealing type are classified into a package type known as BGA (Ball Grid Array) in which a semiconductor element is mounted on a substrate composed of glass epoxy, etc., which is sealed with a resin, and a package type in which the semiconductor element is mounted on a lead frame, which is sealed with the resin.

FIG. 11 is a view showing a sectional structure of the semiconductor device of the type known as the BGA.

In the semiconductor device of the BGA type illustrated therein, a semiconductor element 31 is mounted on a substrate 30 composed of glass epoxy, etc., and a predetermined pattern 32 corresponding to an inner lead is formed on the surface (an upper surface in FIG. 11) of the substrate, on which the element is mounted. Further, a plurality of electrodes 33 are formed on the semiconductor element 31, and are connected to the patterns 32 corresponding thereto via metal wires 34. Moreover, a region peripheral to the semiconductor element 31 which includes the metal wires 34, is sealed integrally with a package resin 35.

On the other hand, patterns 36 corresponding to outer leads are formed on a surface (a lower surface in FIG. 11) opposite to the element mounted surface, and are electrically connected to the above-mentioned patterns 32 via through-holes 37 penetrating the substrate 30. Furthermore, solder balls 38 are fixed to land portions of the respective patterns 36 by using a bonding material 37. These solder balls 36 serve as electrode members for a external connection when packaging the semiconductor device on an unillustrated circuit board, etc., and are arrayed in a grid-like shape on a packaging surface (the lower surface in FIG. 11) of the substrate 30.

Incidentally, in this BGA type semiconductor device, when mounting the semiconductor element 31 for a high-speed process at a high operating frequency, there is taken a measure such as separating the ground from the power supply with the substrate 30 constructed in a multi-layered structure in order to avoid a delay of propagation of the electrical signal due to noises of radiations on a signal line.

In contrast with this, the semiconductor device using the lead frame takes a sectional structure as illustrated in FIG. 12.

In the semiconductor device of the illustrated lead frame type, a semiconductor element 41 is mounted on a die pad 40 of the lead frame. A plurality of electrodes 42 are formed on the semiconductor element 41, and are connected to inner leads 3 corresponding thereto via metal wires 44. Then, a peripheral region of the semiconductor element 41 which embraces the inner leads 43 is sealed integrally with a package resin 45. Further, outer leads 46 extend integrally with the inner leads 43 from side portion of the package resin 45. This outer lead 46 is so molded as to be crooked in a predetermined shape (a gull wing in the illustrative example) corresponding to a packaging mode of the package on the circuit board, etc.

There are, however, the following problems inherent in the above two types of semiconductor devices.

Namely, in the case of the BGA type semiconductor device, the solder balls 38 are two-dimensionally disposed, which is advantageous in terms of a layout of an increased number of pins. However, the substrate 30 defined as the base for the assembly parts is composed of glass epoxy that is comparatively expensive, and hence, as compared with the lead frame type semiconductor device with a simple structure, has a problem of increasing the costs. Further, the substrate 30 absorbs a moisture content in the air during its preservation, and therefore, if poor of an adhesion of the package resin 35 to the substrate 30, there might be problems caused by a low moisture resisting property and a slow solder heat resisting property as well, wherein an interface therebetween is exfoliated due to soldering during the substrate packaging process, and cracks tend to occur in the package resin 35 due to a mismatch in thermal expansion coefficient with respect to the substrate 30.

On the other hand, the lead frame type semiconductor device takes such a structure that the outer leads 46 largely protrude outwardly of the package resin 45, and is therefore disadvantageous in terms of downsizing the device as a whole. Moreover, the outer lead 46 is very easy to bend because of being elongate, and this type of semiconductor device is limited in terms of the layout of the increased number of pins in consideration of copulation (flatness) of a lead connecting portion when in the substrate packaging process.

Further, the lead frame serving as the base for the assembly parts is composed of the metal material, and, besides, takes the structure assuming as simple a configuration as a plate. Therefore, although lower in price than in the BGA type semiconductor device described above, the latter semiconductor device tends to cause the noises between the signals because of the lead frame taking the single-layered structure and is not suited to mount the semiconductor element 41 requiring the high-speed process. Accordingly, in that case, there is no alternative but to adopt the structure of the above-mentioned BGA type, and, as a result, there is a disadvantage of increasing the costs.

SUMMARY OF THE INVENTION

It is a primary object of the present invention, which was inspired under such circumstance, to provide a semiconductor device capable of corresponding to an increased number of pins and of downsizing the device.

To accomplish the above object, according to one aspect of the present invention, a semiconductor device of the present invention comprises a lead frame including a die pad for mounting en element and lead terminals arranged in a peripheral area of the die pad, a semiconductor element mounted on the die pad of the lead frame, a metal wire with its one end connected to an electrode portion of the semiconductor element and with its other end connected to one end of the lead terminal, a package resin for sealing the semiconductor element, and electrode members so provided at the other sides of the lead terminals as to protrude.

Thus, since the electrode members are so provide at the other ends of the lead terminals as to protrude, it is feasible to make an electrical connection to the circuit board through the above electrode members without causing large protrusions of the lead terminals from the package resin as stated above when packaged on the circuit board, etc.

Further, the semiconductor device according to the present invention takes such a construction that the sealing by the package resin is effected over a peripheral area thereof and up to an outer region of disposing positions of the electrode members, and the package resin is formed with recessed portions corresponding to the disposing positions of the electrode members.

Thus, the electrode members can be positioned by the recessed portions formed in the package resin, and a positioning accuracy of the electrode member can be thereby enhanced.

Moreover, the semiconductor device according to the present invention adopts such a construction that an impedance element for adjusting an impedance component of a signal transmission path is additionally provided midways of the signal transmission path extending from the metal wire to the electrode member.

According to the above constructions, the impedance element adjusts the impedance component of the signal transmission path extending from the metal wire to the electrode member, whereby an influence of noises from the adjacent signal transmission path is hard to receive.

BRIEF DESCRIPTION OF THE DRAWINGS

Other objects and advantages of the present invention will become apparent during the following discussion in conjunction with the accompanying drawings, in which.

DETAILED DESCRIPTION OF THE PREFERRED EMBODIMENTS

Embodiments of the p resent invention will hereinafter be described in greater detail with reference to the accompanying drawings.

Figure 1:
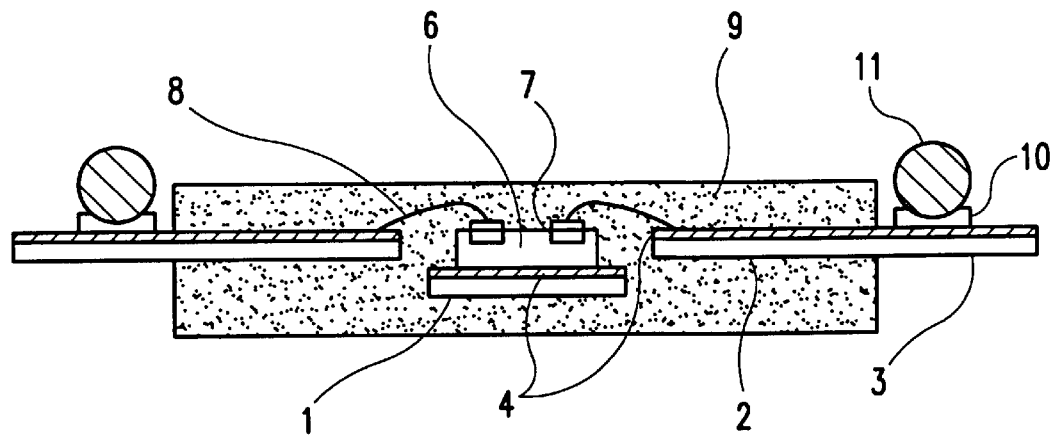
FIG. 1 is a side sectional view showing a first embodiment of a semiconductor device according to the present invention.
Figure 2:
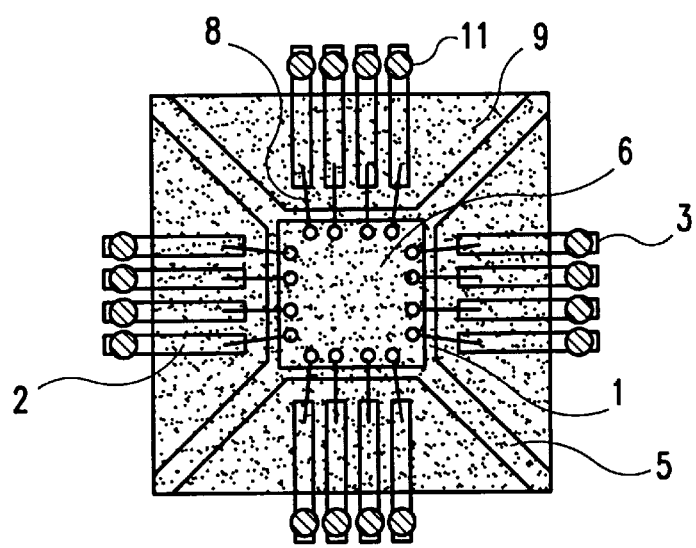
FIG. 2 is a perspective plan view showing the first embodiment of the semiconductor device according to the present invention.

FIG. 1 is a side sectional view sowing a first embodiment of a semiconductor device according to the present invention. FIG. 2 is a plan perspective view thereof.

In the semiconductor device illustrated therein, a plating layer 4 composed of gold or silver is formed on surfaces of a die pad 1, an inner lead 2 and an outer lead 3 of a lead frame. This plating layer 4 is, e.g., approximately 5 $\mu$m in thickness when formed on the surface of the lead frame including the die pad 1, the inner lead 2 and the outer lead 3. The die pad 1 is formed in a rectangular shape as viewed in plan corresponding to a configuration of a semiconductor element which will be mentioned later on, and four corners thereof are supported by suspension leads 5. Further, the die pad 1 is sunk lower than the inner lead 2 by a depressing process of the lead frame. The inner lead 2 is disposed so that one end thereof is in close proximity to a peripheral edge of the die pad 1, and the outer lead 3 extends integrally from this inner lead 2. Further, the inner lead 2 and the outer lead 3 are flush with each other over the whole areas from one ends thereof to the other ends thereof.

On the other hand, a chip-like semiconductor element 6 taking a rectangular shape as viewed in plan is mounted on the die pad 1 of the lead frame. This semiconductor element 6 is fixed to the die pad 1 by use of a bonding material (unillustrated) such as, e.g., silver paste, solder paste, etc. A plurality of electrodes (aluminum electrodes) 7 are provided at a predetermined pitch on the upper surface of the semiconductor element 6, and are connected to the inner leads 2 corresponding thereto via metal wires 8 such as gold wires, etc.

Moreover, a peripheral region of the semiconductor 6 including the inner leads 2 and the metal wires 8 is resin-sealed integrally with a package resin 9. This package resin 9 is composed of a thermosetting resin such as, e.g., epoxy-series resins, etc. and functions to protect the semiconductor element 6 and its peripheral parts (such as the metal wires 8 and so on) from an external environment. Note that the package resin 9 may involve the use of thermoplastic resins.

On the other hand, solder balls 11 are fixed to the outer leads 3 extending outwardly of the package resin 9 through bonding materials 10 such as, e.g., a conductive resin and solder paste. This solder ball 11 serves as an electrode member for an external connection when packaging the semiconductor device on a circuit board, etc., and is connected to the outer lead 3 via the plating layer 4 formed on the surface thereof. Further, the solder ball 11 is provided in such a state as to protrude by a predetermined quantity (e.g., on the order of 0.2–0.3 mm) from the packaging surface of the package resin 9 with respect to the above circuit board.

Herein, supposing that the lead frame is composed of, e.g., an iron-series alloy such as 42 alloy material, etc., a frame base material surface remarkably worsens in terms of a soldering property, etc., and hence, if it remains as it is, it is extremely difficult to connect the metal wire 8 and fix the solder ball 11. Under such circumstances, in the first embodiment, the plating layer 4 composed of gold or silver is formed on the surface of the lead frame including at least the inner leads 2 and the outer leads 3, thereby enhancing a bonding property of the metal wire 8 to the inner lead 2 and a bonding property of the solder ball 11 to the outer lead 3 through an intermediary of the plating layer 4. Accordingly, it is feasible to use other conductive materials such as, e.g., palladium in addition to gold and silver given above as a material of the plating layer 4 on condition that such materials exhibit a high bonding property to the metal wire 8 and the solder ball 11 as well.

Note that according to the construction of the semiconductor device illustrated in FIG. 1, the plating layer 4 is formed also on the die pad 1 except for the lead terminals (2, 3), however, this die pad portion 1 may be formed with the plating layer 4 as the necessity arises.

In the case of packaging the thus constructed semiconductor device on the circuit board, the semiconductor device is mounted on the circuit board in such a manner that the solder ball 11 serving as the electrode member is directed downward. In this case, there exist lands corresponding to positions of the respective solder balls 11 on the circuit board, and these lands are also brought into a state of being connected to the solder balls 11. In this state, the solder balls 11 are fused by heating through a reflow process, etc., whereby the circuit board is electrically connected to the semiconductor device.

At this time, it might happen that the package resin 9 comes into contact with the circuit board due to the fusion of the solder balls 11. Assuming that a core portion of the solder ball 11 be fused at a temperature higher than a reflow temperature and that a ball external portion around the core be fused at a temperature lower than the reflow temperature by changing a proportion of lead and tin of which the solder ball 11 is mainly composed, a gap between the package resin 9 and the circuit board when in the board packaging process can be adjusted to a desired dimension by properly setting a size of the core portion of the solder ball 11.

Thus, in the state where the semiconductor device is packaged on the circuit board, an electric signal of the semiconductor element 6 when in a real operation is transmitted from the electrode 7 via the metal wire 8 to the lead terminals (2, 3) and further to the circuit board via the solder ball 11 on the lead terminal (the outer lead 2).

Subsequently, a method of manufacturing the semiconductor device in the first embodiment will be explained.

Figure 3A:
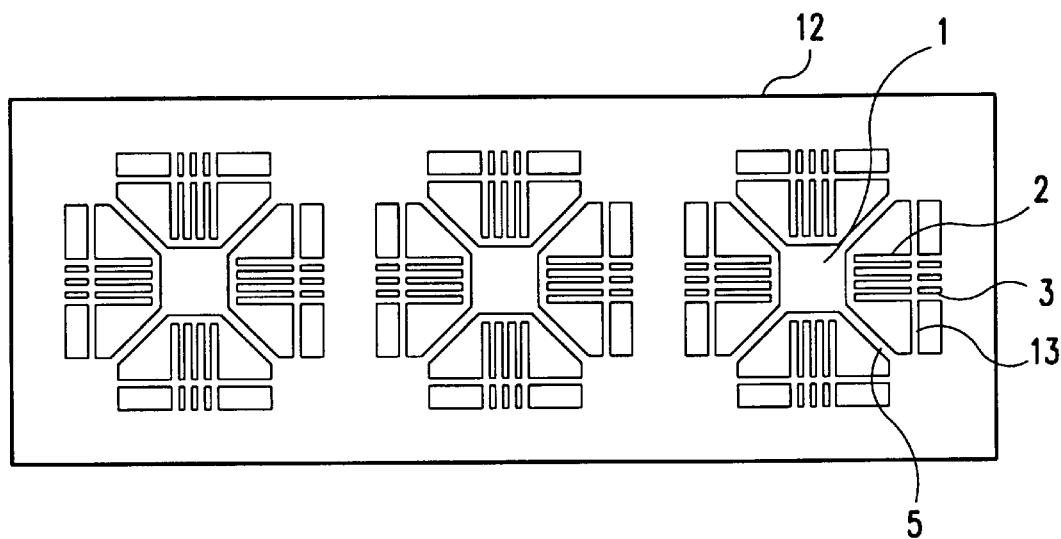
FIGS. 3(*a*) and 3(*b*) are explanatory diagrams showing a method of manufacturing the semiconductor device in the first embodiment (part 1)

To start with, as illustrated in FIG. 3(a), a plate-like lead frame 12 composed of a metallic material such as a ferrous alloy series material or a copper alloy series material, is shaped by processing. A shape processing method in this case is classified into a chemical method of covering a necessary portion with a mask created based on a predetermined design dimension and removing an unnecessary portion excluding the mask by etching, and a mechanical method of punching out the unnecessary portion by a metal mold created based on a predetermined design dimension. Herein, however, both of these methods may be available.

With the shape processing described above, the lead frame 12 is formed with the die pad 1 serving as an element mounting member, and the suspension leads 5 for supporting this die pad. Further, the plurality of inner leads 2 are formed at the portions peripheral to the die pad 1, and the outer leads 3 are formed integrally with these inner leads 2. Moreover, dam bars 13 are provided between the respective leads, resulting in a state where the leads are connected to each other by these dam bars 13.

Next, a plating process of gold and silver is effected on the surface of the lead frame including at least the lead terminals (2, 3) with respect to the shape-processed lead frame 12, thereby forming the plating layer 4 described above (see FIG. 1). In this case, the plating process is executed also on the die pad 1 together with the lead terminals (2, 3), whereby, as shown in FIG. 1, the plating layers 4 are formed on the surfaces of the die pad 1 and of the lead terminals (2, 3).

At this stage, the manufacturing process of the lead frame 12 as a single body is finished.

Figure 3B:
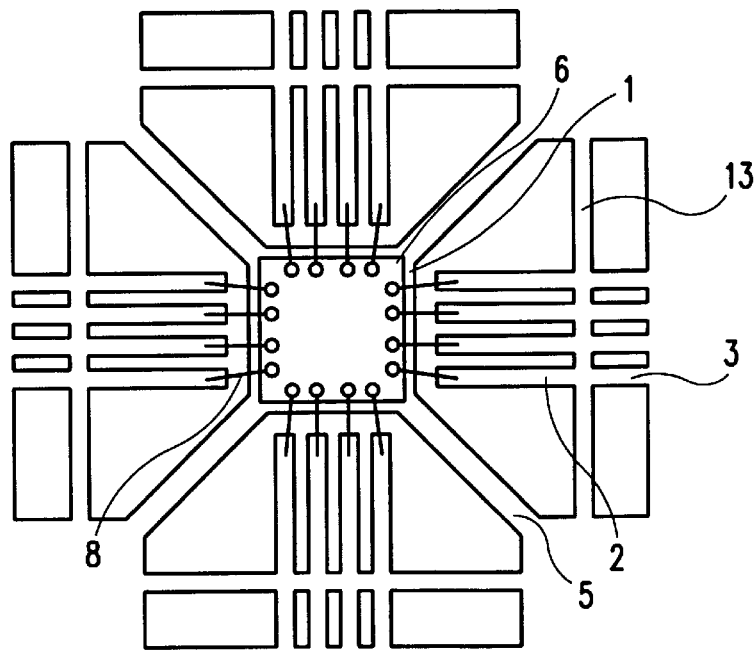

Thereafter, the lead frame 12 is shifted to a die bonding process, wherein, as shown in FIG. 3(b), the semiconductor element 6 is fixedly mounted on the die pad 1 of the lead frame by use of an unillustrated bonding material (e.g., silver paste, solder paste, etc.).

Next, the lead frame on which the element has already been mounted is shifted to a wire bonding process, wherein, as shown in FIG. 3(b), the electrodes on the semiconductor element 6 are connected to the inner leads 2 corresponding thereto via the metal wires 8 such as the gold wires. In this case, the plating layers 4 exhibiting the high bonding property to the metal wires 8, exist on the surfaces of the inner leads 2, and therefore one ends of the metal wires 8 can be firmly bonded to the inner leads 2 through these plating layers 4.

Figure 4A:
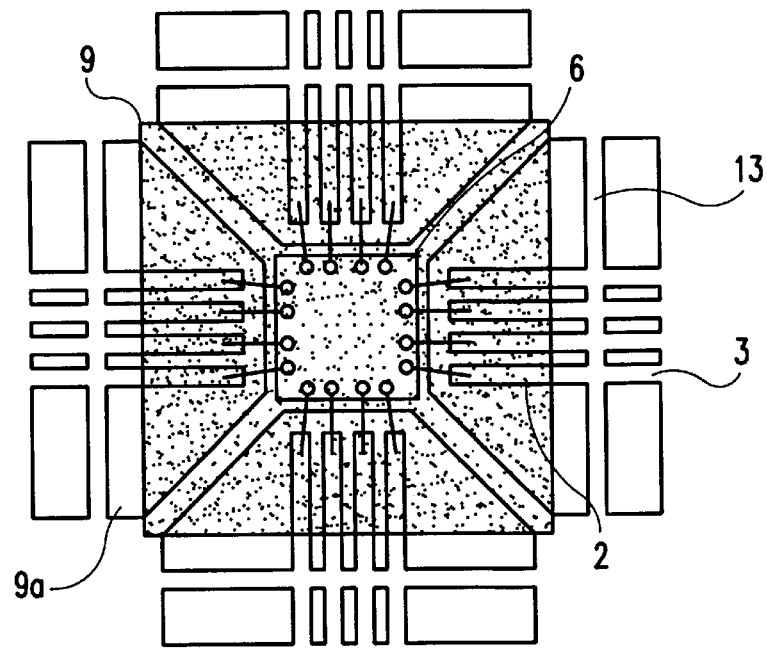
FIGS. 4(*a*) and 4(*b*) are explanatory diagrams showing a method of manufacturing the semiconductor device in the fist embodiment (part 2)

Subsequently, the lead frame is shifted to a resin sealing process, wherein, as shown in FIG. 4(a), the peripheral region of the semiconductor element 6 is resin-sealed integrally with the package resin 9. In this resin sealing process, the semiconductor element 6 may be sealed by a known molding method such as a transfer molding method, etc. In this case, the dam bars 13 function to prevent a flow of the resin from between the leads, and are therefore filled inside with unnecessary resins 9a.

Figure 4B:
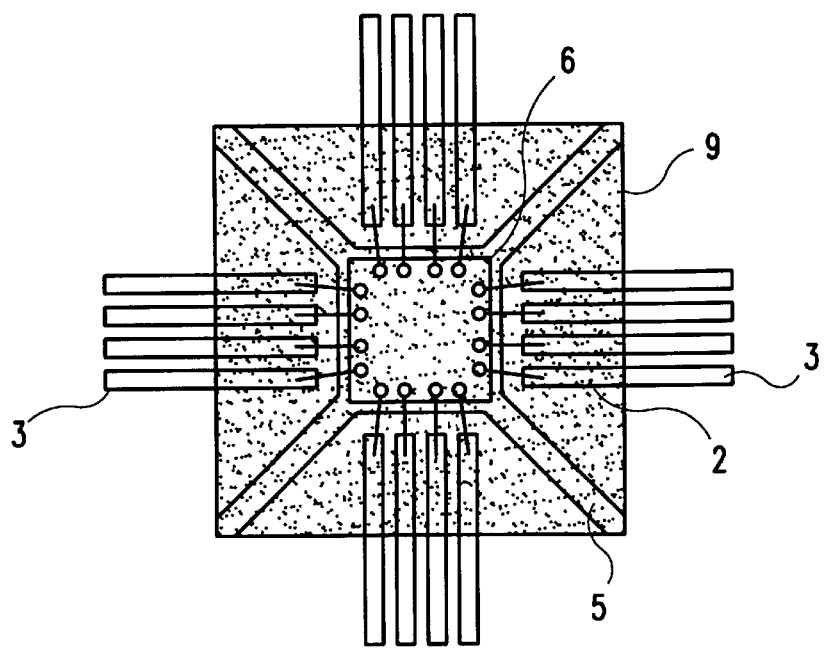

Subsequently, as shown in FIG. 4(b), the unnecessary resin (burr) 9a along the outer edge of the package resin 9 is removed, and the individual lead terminals (the inner leads 2, and the outer leads 3) are made independent by cutting the dam bars 13 through which the leads have been connected so far. Further, the outer leads 3 are cut to a predetermined length, and the suspension leads 5 are cut along the outer edge of the package resin 9, thereby electrically separating the leads terminals from each other. Besides, the package is separated from an outer frame of the lead frame.

Finally, as illustrated in FIGS. 1 and 2 given above, a bonding material 10 such as the conductive resin or the solder paste is supplied to the side on which the plating layers 4 are formed on the outer leads 3 extending from the packaging resin 9, and the solder balls 11 are fixed onto the outer leads 3 through this bonding material 10. More specifically, the solder balls 11 are tentatively fixed into the outer leads 3 through the bonding material 10, from which state the solder balls are fixed by fusing the bonding material 10 by a heating process.

At this time, the plating layers 4 exhibiting the high bonding property to the solder balls 11 are formed on the surfaces of the outer leads 3, and hence the solder balls 11 can be firmly bonded to the outer leads 3 through these plating layers 4. When in the heating process after the tentative fixation, however, it is of importance to select a material having a melting point well lower than the melting point of the solder on the surface of the solder ball 11 as the bonding material 10 for fixing the solder ball 11 so that the solder on the surface of the solder ball 11 is not fused before the bonding material 10 is fused. Note that a method of forming the solder ball 11 may involve coating the solder paste thick on the outer lead 3, forming the solder paste in a spherical shape by the reflow process and thereby obtaining a desired solder ball 11.

The semiconductor device in the first embodiment is completed by the processes described above.

In the semiconductor device in the first embodiment, the solder balls 11 serving as the electrode members are so provided as to swell on the outer leads 3 extending outwardly of the package resin 9. Therefore, when packaged on the circuit board, etc., the electrical connection to the circuit board via the solder balls 11 can be made without large protrusions of the lead terminals from the package resin as seen in the prior art. Accordingly, the length of the outer lead 3 can be by far shorter than in the semiconductor device of the conventional lead frame type. With this decrease in the length, the protrusions of the leads from the package resin 9 are minimized, and the solder balls can be made closer to the package resin 9 (inwardly).

Moreover, it is possible to provide an inexpensive semiconductor device because of taking the lead frame type, and, besides, when manufacturing this device, troublesome external processing (solder plating, etc.) of the outer lead is not required, which makes it feasible to further decrease the costs. Further, the existing assembly equipment corresponding to the lead frame type can be directly utilized, and hence there is no large increase in the costs due to an investment of the equipment.

Incidentally, even the semiconductor device of the lead frame type, if the electric signal of the semiconductor element 6 to be mounted is on the order of 50 MHz or less, can be operated receiving almost no influence of a propagation delay due to noises of radiations, etc.

In addition, the portion sealed with the package resin 9 takes a sectional structure equal to that in the conventional lead frame type, and therefore an equal capability in terms of a solder heat resisting property when packaged on the board can be also secured. Further, as for a mismatch between thermal expansion coefficients of the circuit board defined as the packaging target, the solder ball 11, the outer lead 3 and the package resin, since the outer lead 3 exhibits an effect of relaxing the stress, a high reliability can be secured.

Figure 5:
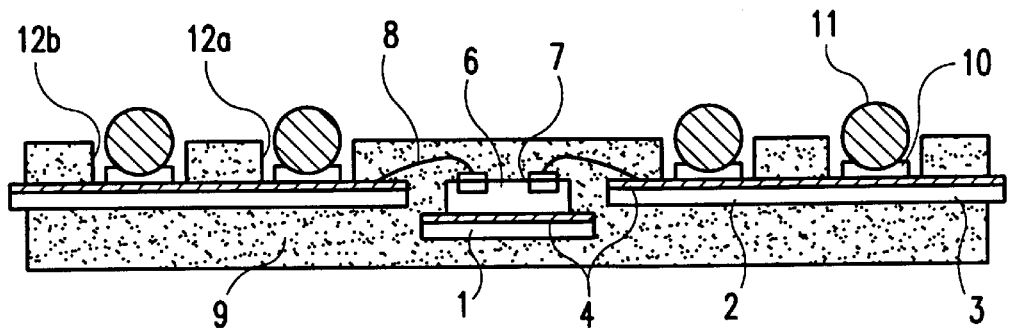
FIG. 5 is a side sectional view illustrating a second embodiment of the semiconductor device according to the present invention.
Figure 6:
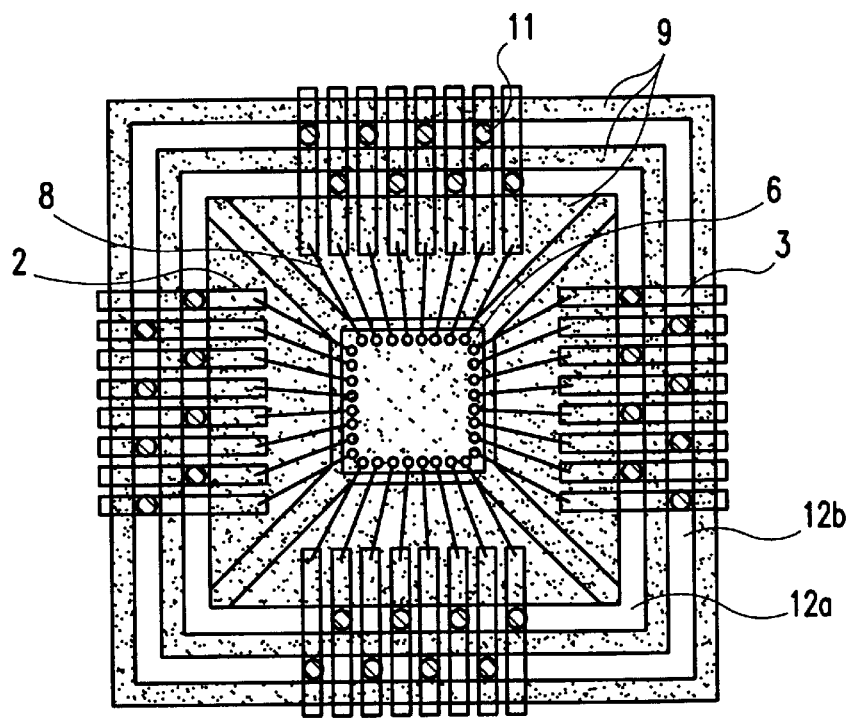
FIG. 6 is a perspective plan view showing the second embodiment of the semiconductor device according to the present invention.

FIG. 5 is a side sectional view showing a second embodiment of the semiconductor device according to the present invention. FIG. 6 is a plan perspective view thereof.

The semiconductor device shown in FIGS. 5 and 6 includes the die pad 1 of the lead frame, the inner leads 2 thereof, the outer leads 3 thereof, the plating layer 4 formed on the frame surface, and the suspension leads 5 for supporting the die pad 1. Further, the semiconductor element 6 is fixedly mounted on the die pad 1, and electrodes 7 are provided on the semiconductor element 6. The metal wire 8 connects the electrode 7 on the semiconductor element 6 to the inner lead 2. The package resin 9 seals the peripheral region of the semiconductor element 6. The solder ball 11 is fixed onto the outer lead 3 via the bonding material 10.

Herein, the second embodiment is different from the first embodiment discussed above in terms of the particular configuration of the package resin 8 and the sealing region thereof.

To be specific, in the case of the first embodiment discussed above, the portions exclusive of the outer leads 3 are sealed with the package resin 9. In the case of the second embodiment, however, the area sealed by the package resin 9 embraces also the outer leads 3.

Further, square-frame-shaped recessed grooves 12a, 12b are formed double in one surface (an upper surface in the Figure), corresponding to the configuration of the package resin 9 and to the disposing positions of the solder balls 11. These recessed grooves 12a, 12b are so provided as to be positioned on the side of plate processing surfaces of the outer lead 3, thereby bringing into a state where some portions of the outer leads 3 are exposed. Furthermore, a width of each of the recessed grooves 12a, 12b is set slightly larger a diameter of the solder ball 11 so that the solder ball 11 is just fitted therein. Moreover, the solder ball 11 is fixed via the inner recessed groove 12a to one outer lead 3 of the outer leads 3 adjacent to each other, while the solder ball 11 is fixed via the outer recessed groove 12b to the other outer lead 3. That is, the individual solder balls 11 are disposed in a staggered pattern in the arranging direction (in a package peripheral direction) of the outer leads 3.

Note that the process of packaging the semiconductor device on the circuit board and the signal transmission route of the semiconductor element 6 after being packaged on the board, are the same as those in the first embodiment discussed above, and their explanations are herein omitted.

Subsequently, a method of manufacturing the semiconductor device in the second embodiment will be described.

To begin with, as in the same way with the first embodiment discussed above, the shape processing is effected on the lead frame composed of the metal material such as the ferrous alloy series, and thereafter the plating process is executed on the surface of the lead frame including the lead terminals (the inner leads and the outer leads), thus completing the lead frame.

Figure 7:
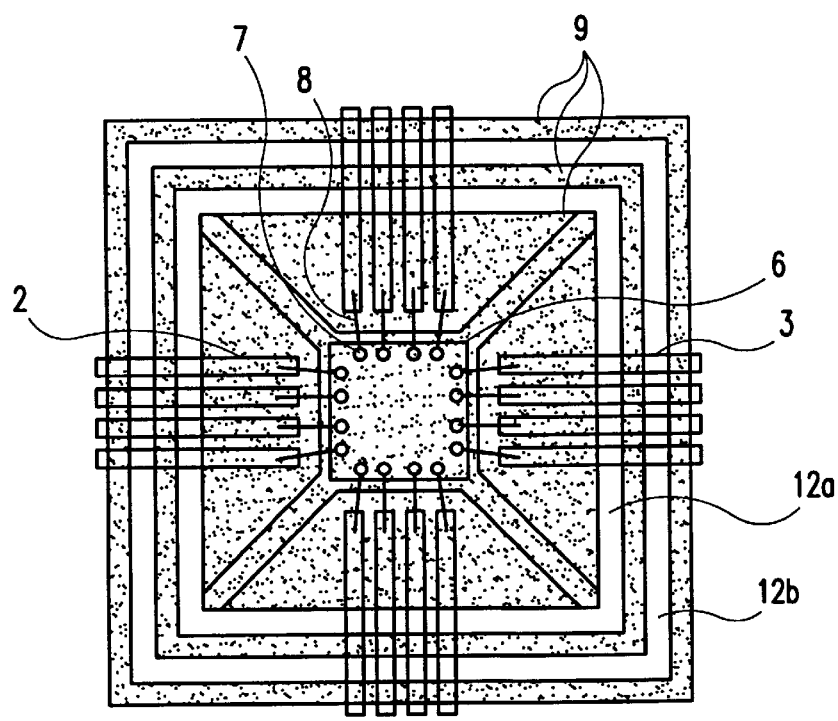
FIG. 7 is an explanatory diagram showing a method of manufacturing the semiconductor device in the second embodiment.

Next, as illustrated in FIG. 7, after the semiconductor element 6 has been fixedly mounted on the die pad 1 of the lead frame, the electrodes 7 of the semiconductor element 6 are connected via the metal wires 8 to the inner leads 2 corresponding thereto. Thereafter, the region peripheral to the semiconductor element 6 is resin-sealed by the molding method such as the transfer molding method, etc. In this case, the ends of the outer leads 3 or the portions vicinal thereto are sealed by the package resin 9, and the recessed grooves 12a, 12b are integrally formed in one surface of the package resin 9. Some portions of the outer leads 3 are thereby exposed. Thereafter, the outer leads 3 and unillustrated dam bars are cut off along the outer edge of the package resin 9, thereby bringing into a state shown in FIG. 7.

Subsequently, the bonding materials 10 (see FIG. 5) such as the conductive resin and the solder paste are coated over some portions of the outer leads 3, which are exposed outside in the recessed grooves 12a, 12b of the package resin 9, and the solder balls 11 (see FIG. 5) are fixed onto the outer leads 3 through the bonding material 10. At this time, the individual solder balls 11 are fixed to the outer leads 3 in the state of their being fitted into the recessed grooves 12a, 12b of the package resin 9, whereby the positions of the solder balls 11 in the lead longitudinal directions (up-and-down/right-and-left directions In FIG. 7) are regulated by the recessed grooves 12a, 12b.

With the processes executed so far, the semiconductor device in the second embodiment is completed.

According to the semiconductor device in the second embodiment, new effects which follow are obtained particularly in the comparison with the first embodiment discussed above.

Namely, since the recessed grooves 12a, 12b for positioning the solder balls 11 are formed in the package resin 9, when the solder balls 11 are, for example, treated as the individual members previously molded in the spherical shape, a positioning precision of the solder balls 11 can be enhanced by their being fitted into the is recessed grooves 12a, 12b.

Note that the recess ed grooves 12a, 12b are formed double in the package resin 9 as one contrivance for positioning the solder balls 11 previously molded in the spherical shape as explained above in the second embodiment. In addition to this, however, though not illustrated, for instance, the package resin 9 is formed with recessed portions each taking circular or square shape as viewed in plan which are slightly larger than the ball diameter in such a form as to correspond to the packaging positions of the respective solder balls 11. This makes it feasible to position the solder balls 11 in biaxial directions orthogonal to each other, which arrangement becomes by far more preferable.

Further, in the second embodiment, the respective solder balls 11 are arranged in the staggered pattern. This arrangement is exemplified as one mode for actualizing a layout of the increased number of pins by setting the lead arranging pitch as narrow as possible without permitting the contact between the solder balls 11 on the outer leads 3 adjacent to each other. Accordingly, there might be a case where the solder balls 11 are not necessarily arranged in the staggered pattern depending the number of pins required. Therefore, in this case, as in the same way with the first embodiment discussed above, the respective balls 11 are disposed on the same one line, whereby the downsizing of the semiconductor device can be attained.

Figure 8:
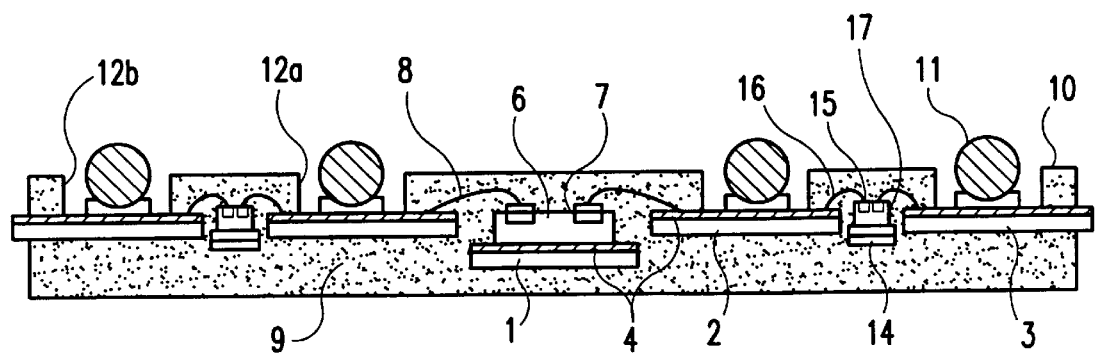
FIG. 8 is a side sectional view illustrating a third embodiment of the semiconductor device according to the present invention.
Figure 9:
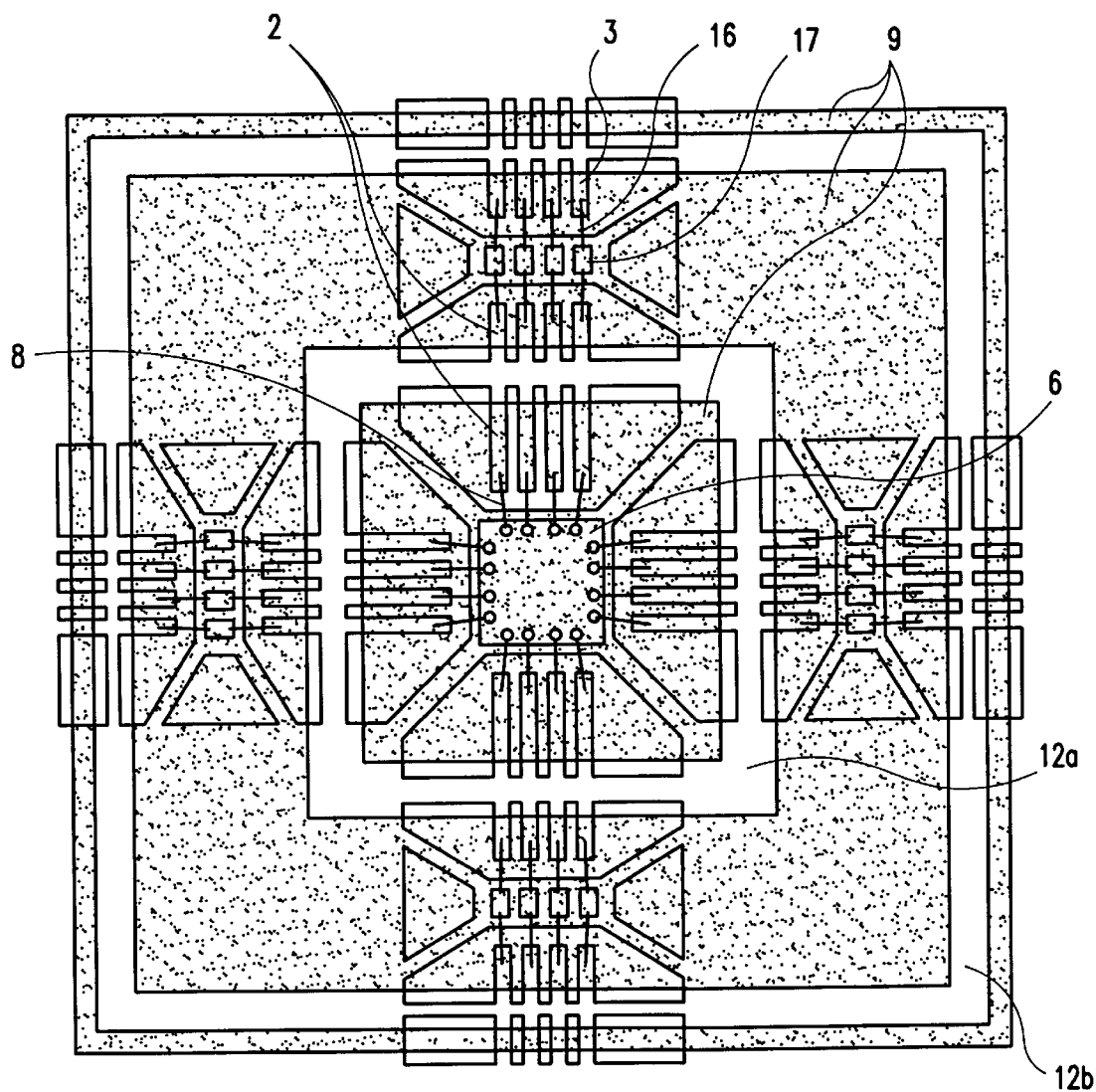
FIG. 9 is a perspective plan view showing the third embodiment of the semiconductor device according to the present invention.

FIG. 8 is a side sectional view showing a third embodiment of the semiconductor device according to the present invention. FIG. 9 is a plan perspective view thereof. FIG. 9, however, shows a state after being sealed with the resin.

The semiconductor device in the third embodiment is different from the second embodiment discussed above especially in terms of such a point that an impedance element 13 is additionally provided midway in the signal transmission path extending from the metal wire 8 to the solder ball 11.

The impedance element 17 is an element for adjusting impedance components such as an inductance component, a capacitance component and a resistance component. When adjusting, e.g., the capacitance component of the signal transmission path, a chip capacitor and an element incorporating the same function as that of the chip capacitor are to be adopted. Further, in the case of adjusting the resistance component, a chip resistor and an element incorporating the same function as that of the chip resistor are to be adopted.

Moreover, the signal transmission path lead to the solder ball 11 from the metal wire 8 is formed of the inner lead 2 and the outer lead 3, and therefore a die pad 14 is separately provided at a boundary portion therebetween. The impedance element 17 is fixedly mounted on this die pad 14. Then, an electrode 15 on the impedance element 13 is electrically connected to both of the inner lead 2 and the outer lead 3 via a metal wire 16. Furthermore, a region peripheral to the semiconductor element 6 excluding the packaging positions of the solder ball 11, is resin-sealed integrally with the package resin 9 in such a form as to include the impedance element 17 and the metal wire 16.

When packaging the thus constructed semiconductor device on the circuit board, etc., as in the same way with the first and second embodiments discussed above, the solder ball 11 serving as an electrode member is soldered to a land portion on the circuit board. Further, in the state where the semiconductor device is thus packaged on the circuit board, the electric signal of the semiconductor element 6 when in a real operation is transmitted from a electrode 7 thereof via the metal wire 8 to the inner lead 2, and further to the circuit board from the solder ball 11 on the outer lead 3 via the impedance element 13 described above.

Subsequently, a method of manufacturing the semiconductor device in the third embodiment will be explained.

To begin with, as in the same manner with the first and second embodiments discussed above, the shape processing is effected on the lead frame composed of the metal material such as the ferrous alloy series, and thereafter the plating process is executed on the surface of the lead frame including the lead terminals (the inner leads and the outer leads), thus completing the lead frame. In this case, the lead frame is, as illustrated in FIG. 10, formed with the die pad 14 positioned at the boundary portion between the inner lead 2 and the outer lead 3.

Figure 10:
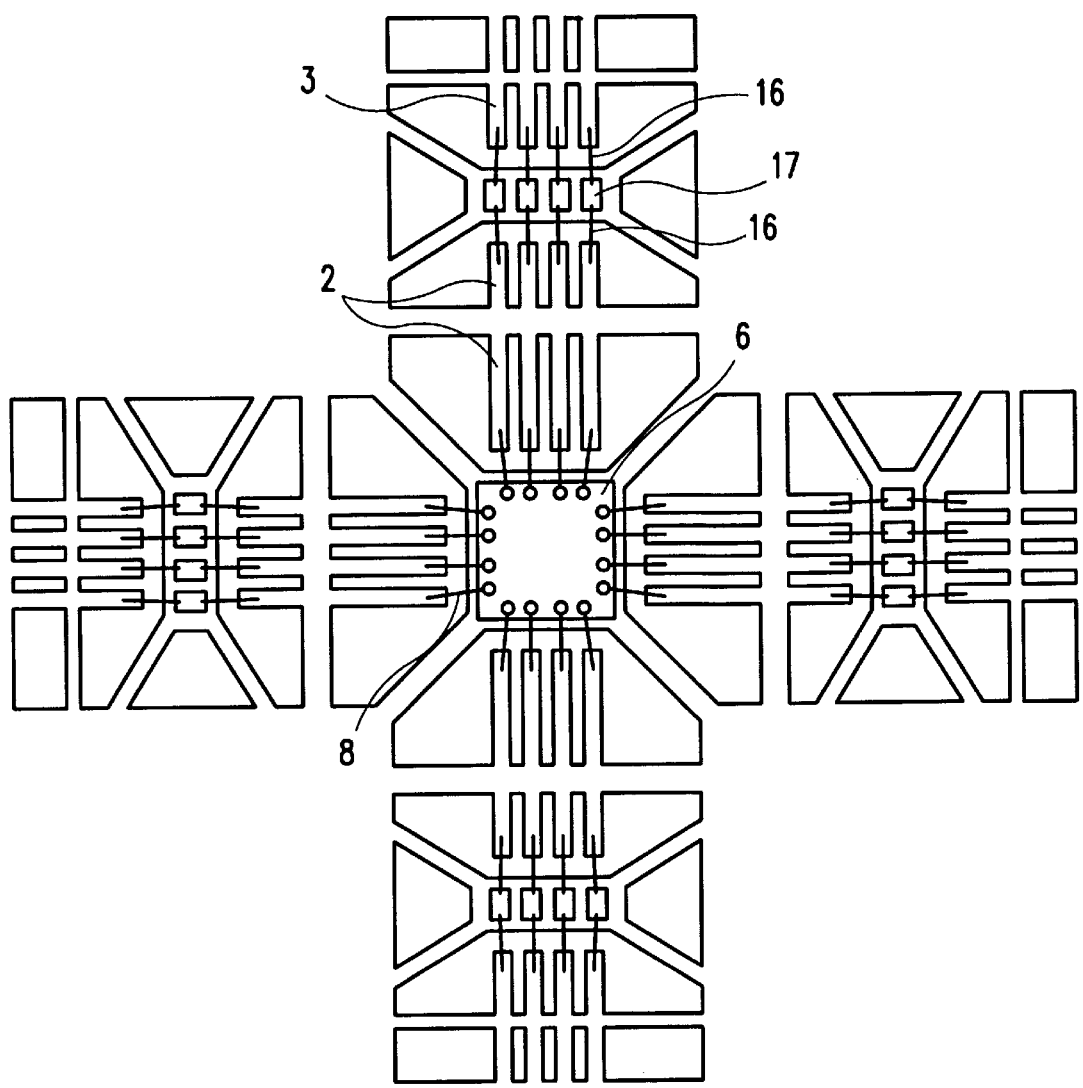
FIG. 10 is an explanatory diagram showing a method of manufacturing the semiconductor device in the third embodiment.
Figure 11:
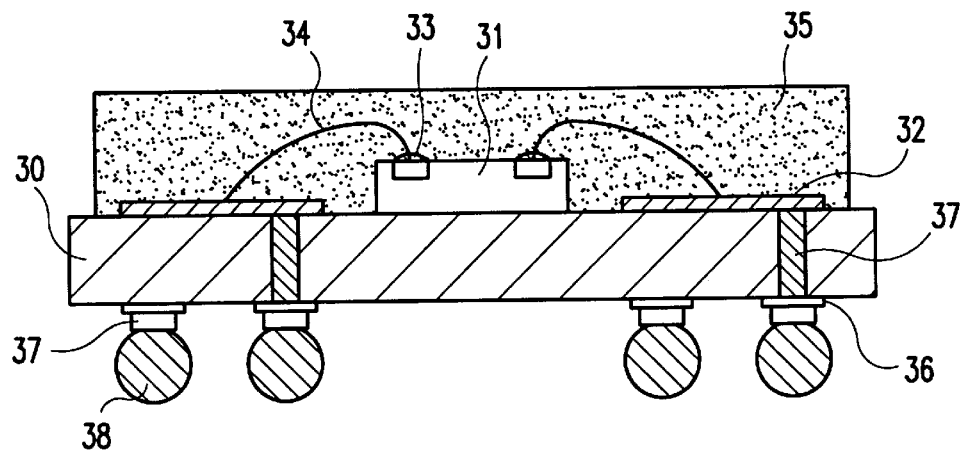
FIG. 11 is a side sectional view showing a conventional example (a BGA type)
Figure 12:
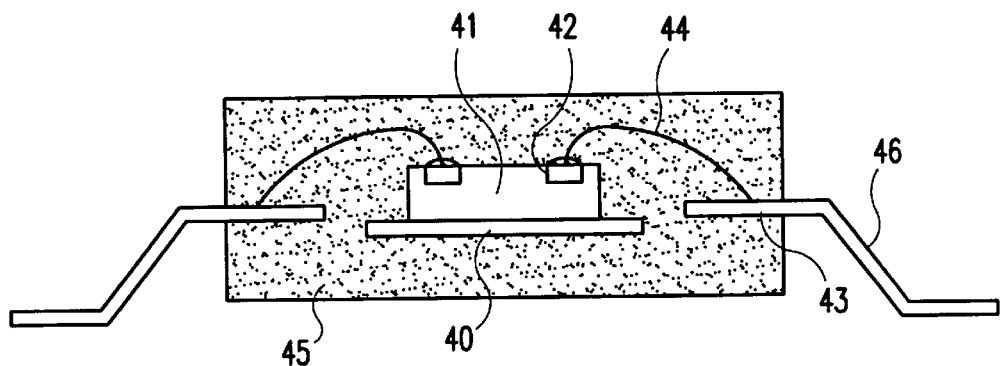
FIG. 12 is a side sectional view showing another conventional example (a lead frame type).

Next, as illustrated in FIG. 10, the semiconductor element 6 is fixedly mounted on the die pad 14 (see FIG. 8) of the lead frame, and the impedance element 17 is fixedly mounted on the die pad 14 between the inner lead 2 and the outer lead 3. Further, the electrode 7 of the semiconductor element 6 and the inner lead 2 corresponding thereto are connected to each other via the metal wire 8, and the impedance element 17 is connected to the inner and outer leads 2, 3 via the metal wire 16. Thereafter, as previously shown in FIG. 9, the peripheral region of the semiconductor element 6 is resin-sealed by the molding method such as the transfer molding method, etc. In this case, the package resin 9 to be formed by molding is formed integrally with the recessed grooves 12a, 12b for the positioning process, corresponding to the packaging positions of the solder balls 11 as shown in FIG. 8.

Subsequently, the outer leads 3 and the unillustrated dam bars are cut off along the outer edge of the package resin 9, and thereafter the solder balls 11 are fixed onto the outer leads 3 through the recessed grooves 12a, 12b of the package resin 9.

With the processed executed so far, the semiconductor device in the third embodiment is completed.

The semiconductor device in the third embodiment exhibits new effects which follow in the comparison with the first and second embodiments discussed above.

To be specific, the impedance element 13 is additionally provided midway in the signal transmission path extending from the metal wire 8 to the solder ball 11, and the impedance component such as the capacitance, etc. made adjustable by this impedance element 13. Hence, the influence by the radiation noise from the adjacent signal transmission path is hard to receive.

Owing to the above-mentioned, the semiconductor device of the lead frame type becomes capable of avoiding a delay of transmission due to the influence by the noises even when the electrical signal of the semiconductor element 16 to be mounted reaches a high velocity enough to exceed 50 MHz.

Note that the third embodiment has been described in the mode of adding the impedance element 13 to the semiconductor device in the second embodiment described above. Other than this mode, there may be adopted a mode of adding the impedance element 13 to the semiconductor device in the first embodiment described above, i.e., a mode in which a die pad (unillustrated) is separately provided midways of the inner lead 2 partly constituting the signal transmission path in such a form as to be separate therefrom within the sealing region of the package resin 9 illustrated in FIGS. 1 and 2, and a wiring process is executed after mounting the impedance element 13 on the die pad.

According to the semiconductor device explained thus far in the embodiments, the electro member is so provided at the other end of the lead terminal as to protrude, and hence, when packaged on the circuit board, the electrical connection to the circuit board can be made through the above electrode members without causing any large protrusions of the lead terminals from the package resin as seen in the prior art. The length of the lead terminal can be thereby remarkably reduced, and therefore a flexure of the lead is hard to occur, which facilitates a correspondence to a layout of an increased number of pins. Further, the semiconductor device can be downsized because of the smaller quantity of protrusions of the lead terminals from the package resin. Moreover, the simply structured lead frame is adopted as an assembly part serving as the base, and it is therefore possible to provide the semiconductor at an extremely low price, which is, as described above, easy to correspond to the layout of the increased number of pins and attains its downsizing. In addition, the sealing structure by the package resin is the same as that of the conventional lead frame type, and hence a solder heat resisting property is more excellent than of a BGA type.

Further, the package resin is formed with the recessed portions corresponding to the disposing positions of the electrode members, and the electrode members can be thereby positioned within the recessed portions. It is therefore feasible, when disposing the electrode members onto the lead terminals, to enhance the positioning precision thereof. This makes it possible to prevent a positional deviation of the electrode member on the lead terminal, with the result that the electrode members on both sides can be aligned accurately when packaging the semiconductor device on the circuit board, etc.

Moreover, the impedance element for adjusting the impedance component of the signal transmission path is additionally provided midways of this signal transmission path extending from the metal wire to the electrode member, which makes it hard to receive the influence by the noises from the adjacent signal transmission path. Therefore, even in the case of adopting the lead frame type, the transmission delay due to the influence by the noises of the radiations can be avoided, and hence the high-speed high-function semiconductor device can be provided at the low price.

It is apparent that, in this invention, a wide range of different working modes can be formed based on the invention without deviating from the spirit and scope of the invention. This invention is not restricted by its specific working modes except being limited by the appended claims.

DESCRIPTION OF THE NUMERALS

1 DIE PAD 2 INNER LEAD
3 OUTER LEAD 4 PLATING LAYER
6 SEMICONDUCTOR ELEMENT 7 ELECTRODE PORTION
8 METAL WIRE 9 PACKAGE RESIN
11 SOLDER BALL 12a, 12b RECESSED GROOVE
13 IMPEDANCE ELEMENT

What is claimed is:

1. A semiconductor device comprising:

a semiconductor element having a plurality of electrodes;

a plurality of leads each having a first end, a second end, a first surface and a second surface opposite the first surface;

a plating layer formed on the first surface of each lead, said first end of the plating layer respectively connected to said plurality of electrodes of said semiconductor element;

a package resin which seals said semiconductor element and the first surface and the second surface of the first end of the leads by molding the package resin, the second end of the leads extending from an outer edge of the resin;

external terminals formed on the second end of the plating layer on the leads; and for each lead, an impedance element provided in between the first end of the lead and the second end of the lead, the impedance element being electrically connected to both the first and second ends of the lead, wherein each of said lead and plating layer are separate from adjacent said lead and plating layer.

2. The semiconductor device of claim 1, wherein a bottom surface of said semiconductor element is lower than a bottom surface of the leads.

3. The semiconductor device of claim 1, wherein the second end of the leads extending from the edge of the resin is flat.

4. The semiconductor device of claim 1, further comprising a die-pad which is made of the same materials as the leads and which mounts the semi conductor element thereon.

5. The semiconductor device of claim 1, wherein the second end of the leads extends vertically from an outer edge of the resin.

6. A semiconductor device comprising:

a semiconductor element having a plurality of electrodes;

a plurality of leads each having a first end, a second end, a first surface and a second surface opposite the first surface;

an impedance element, for each lead of said plurality of leads, in between the first end of the lead and the second end of the lead, the impedance element being electrically connected to both the first and second ends of the lead;

a package resin which seals said semiconductor element and the first surface and the second surface of the first end of the leads by molding the package resin, the second end of the leads extending from an outer edge of the resin; and external terminals formed on the second end of the leads.

* * * * *